United States Patent [19]

Yamazaki

[11] Patent Number: 4,903,102
[45] Date of Patent: Feb. 20, 1990

[54] SEMICONDUCTOR PHOTOELECTRIC CONVERSION DEVICE AND METHOD OF MAKING THE SAME

[75] Inventor: Shunpei Yamazaki, Tokyo, Japan

[73] Assignee: Semiconductor Energy Laboratory Co., Ltd., Hase Atsugi, Japan

[21] Appl. No.: 380,683

[22] Filed: Jul. 14, 1989

Related U.S. Application Data

[63] Continuation of Ser. No. 723,358, Apr. 15, 1985, abandoned.

[30] Foreign Application Priority Data

Apr. 13, 1984 [JP] Japan .................................. 59-74257

[51] Int. Cl.⁴ ............................................. H01L 27/14
[52] U.S. Cl. .......................................... 357/30; 357/2; 357/58; 357/63; 357/90; 437/144
[58] Field of Search ................. 357/2, 30, 58, 63, 90; 437/144

[56] References Cited

U.S. PATENT DOCUMENTS

| | | | |
|---|---|---|---|
| 3,462,311 | 8/1969 | Ross .................................... | 437/144 |
| 3,490,965 | 1/1970 | Webb et al. ........................ | 437/144 |
| 3,542,608 | 11/1970 | Jensen et al. ....................... | 437/144 |
| 4,385,200 | 5/1983 | Hamakawa et al. .............. | 357/30 K |
| 4,532,373 | 7/1985 | Matsuura et al. ................. | 357/30 K |
| 4,591,892 | 5/1986 | Yamazaki .......................... | 357/30 K |

Primary Examiner—Edward J. Wojciechowicz
Attorney, Agent, or Firm—Sixbey, Friedman, Leedom & Ferguson

[57] ABSTRACT

A semiconductor photoelectric conversion device is provided with a PIN structure which comprises P-type, I-type and N-type non-single-crystal semiconductor layers laminated in that order or in the reverse order. The I-type layer contains a recombination center neutralizer by hydrogen or fluorine and is doped with an alkali metal element by lithium, sodium or potassium, in a concentration higher than that of oxygen and/or nitrogen that the I-type layer contains. Further, the I-type layer is doped with a P-type impurity such as boron so as to compensate for the N-type conductivity of the alkali metal element. The PIN structure is formed by a CVD method. The I-type layer is doped with the alkali metal element by using as alkali metal element material gas during the formation of the I-type layer, or by dipping the PIN structure into an aqueous solution of the alkali metal element or implanting alkali metal element ions into the PIN structure after forming the structure.

7 Claims, 2 Drawing Sheets

SEMICONDUCTOR PHOTOELECTRIC CONVERSION DEVICE AND METHOD OF MAKING THE SAME

This application is a continuation of Ser. No. 06/723,358, filed Apr. 15, 1985, now abandoned.

BACKGROUND OF THE INVENTION

1. Field of the Invention

The present invention relates to a semiconductor photoelectric conversion device which has at least one PIN structure in which a p-type, I-type and N-type non-single-crystal semiconductor layers are laminated in that order or in the reverse order. Further, the invention pertains to manufacturing method of such a semiconductor photoelectric conversion device.

2. Description of the prior Art

Heretofore, a wide variety of semiconductor photoelectric conversion devices have been proposed which are of the type having at least one PIN structure such as mentioned above.

The semiconductor photoelectric conversion device has a mechanism that creates, by an incidence of light, carriers, i.e. electron-hole pairs in the I-type non-single-crystal semiconductor layer of the PIN structures and directs electrons and holes of the electron-hole pairs to the N-type and P-type non-single-crystal semiconductor layers, respectively, generating photovoltaic power. Accordingly, in order for the device to obtain a high photoelectric conversion efficiency, it is desirable that the I-type non-single-crystal semiconductor layer has no recombination centers with which the carriers are recombined.

One solution that has been proposed to meet such a requirement is a semiconductor photoelectric conversion device which has the I-type non-single-crystal semiconductor layer of its PIN structure doped with hydrogen serving as a recombination center neutralizer which combines with the recombination centers to neutralize them.

Further, it is desirable for achieving a high photoelectric conversion efficiency that the I-type non-single-crystal semiconductor layer does not contain an impurity which reduces carrier mobility.

The P-type, I-type and N-type non-single-crystal semiconductor layers of the PIN structure are each formed in a reaction chamber by means of a CVD, photo CVD, Plasma CVD or like method. In this case, since air and oil components are likely to remain in the reaction chamber, the I-type non-single-crystal semiconductor layer contains, as an impurity, oxygen and/or nitrogen, which decreases the carrier mobility. In the prior art photoelectric conversion devices, the concentration of such an impurity is as high as $5 \times 10^{18}$ or more through out the I-type layer in its thickwise direction.

Accordingly, the conventional devices have the defect of low photoelectric conversion efficiency for the reason that the I-type layer of the PIN structure contains the impurity in such a high concentration as mentioned above.

Moreover, in the conventional devices, the I-type layer of the PIN structure contains the recombination center neutralizer, as referred to above. However, when the devices are exposed to radiant rays such as protons and $\gamma$ rays, neutron rays or electron rays, the combination of the recombination center and the recombination center neutralizer and the combination of semiconductor elements are destroyed by the rays, newly creating a large number of recombination centers.

Accordingly, the prior art devices possess the shortcoming that the photoelectric conversion efficiency is lowered by the incidence of radiant, neutron or electron rays though the I-type layer of the PIN structure contains the recombination center neutralizer.

SUMMARY OF THE INVENTION

It is therefore an object of the present invention to provide a novel semiconductor photoelectric conversion device which achieves a high photoelectric conversion efficiency and retains it even if exposed to irradiation by radiant, neutron or electron rays.

Another object of the present invention is to provide a novel method which permits easy fabrication of such excellent photoelectric conversion device.

As is the case with the conventional devices, the photoelectric conversion device of the present invention also comprises at least one PIN structure formed by laminating P-type, I-type and N-type non-single-crystal semiconductor layers in this order or in the reverse order, and the I-type layer contains the recombination center neutralizer which combines with recombination centers to neutralize them. In practice, the recombination center neutralizer is hydrogen or fluorine, preferably, hydrogen.

In the device of the present invention, however, the I-type layer is doped with an impurity which is formed by an alkali metal element. In practice, the alkali metal element impurity is lithium (Li), sodium (Na) or potassium (K), preferably, lithium (Li).

The device of the present invention develops photovoltaic power, by the incidence of light, through the same mechanism as in the conventional devices. In this case, since the I-type layer of the PIN structure contains the recombination neutralizer, the photoelectric conversion efficiency is not impaired by the presence of a large number of recombination centers in the I-type layer.

In the device of the present invention, however, the I-type layer is doped with the alkali metal element impurity.

In practice, the concentration of such an impurity is higher than the concentration of the oxygen and/or nitrogen impurity which reduces the carrier mobility. In this case, the oxygen and/or nitrogen impurity contained in the I-type layer has a concentration of $5 \times 10^{18}$ atoms/cm$^3$ or below in the region except those near the P-type and N-type layers, while the alkali metal element impurity contained in the I-type layer has a concentration of $2 \times 10^{19}$ atoms/cm$^3$ or below in the region except near the P-type and N-type layers.

The reason for which the concentration of the alkali metal element impurity is higher than the concentration of the oxygen and/or nitrogen impurity in the I-type layer is that it is intended to leave a relatively large amount of alkali metal element impurity unreacted with the oxygen and/or nitrogen impurity even though the alkali metal element impurity mostly forms a reaction product with the oxygen and/or nitrogen impurity. In practice, when the alkali metal element impurity is lithium (Li), since the lithium (Li), the oxygen (0) and the nitrogen (N) have electron negativities of 1.0, 3.5 and 3.0, respectively, there exists a relatively large difference of electron negatively between the alkali metal element (Li) impurity and the oxygen and/or nitrogen impurity. Therefore, a reaction product (Li$_2$O) is formed in the I-type layer by the reaction between the alkali metal element impurity and the oxygen and/or nitrogen impurity. In this case, when the recombination center neutralizer contained in the I type layer is hydrogen (H), the alkali metal element (Li) impurity also reacts with the recombination center neutralizer to form a reaction product (LiOH) in the I-type layer. Further, a reaction product by the reaction between the alkali metal element (Li) impurity and the nitrogen impurity is also formed in the I-type layer.

When the photoelectric conversion device is irradiated by radiant, neutron or electron rays, the combination between the semiconductor elements and the combination of the recombination center and the recombination center neutralizer are destroyed in the I-type layer, generating therein new recombination centers. In the case where the semiconductor forming the I-type layer is silicon (Si) and the recombination center neutralizer contained in the I-type layer is hydrogen (H), since the silicon (Si) and the hydrogen (H) have electron negativities of 1.8 and 2.1, respectively, difference in electron negativity between the semiconductor (Si) and the recombination center neutralizer (H) is small. On account of this, when new recombination centers (dangling bonds of silicon) are created in the I-type layer, substantially no recombination center neutralizer combines with the newly created recombination centers. But, the I-type layer is doped with the alkali metal element impurity as mentioned above. In the case where the semiconductor forming the I-type layer is silicon (Si) as referred to above and the alkali metal element impurity (Li) combines with the newly developed recombination centers (dangling bonds of silicon) to neutralize them. In this case, the atomic radius of the alkali metal element (Li) impurity is small, and the concentration of the oxygen and/or nitrogen impurity contained in the I-type layer is low. Accordingly, the alkali metal element (Li) impurity effectively neutralizes the newly generated recombination centers (dangling bonds of silicon).

Further, according to the present invention, the I-type layer is doped with a P-type impurity so as to compensate for the N-type conductivity of the alkali metal element impurity, thereby making the I-type layer more intrinsic. This permits high efficiency creation of carriers in the I-type layer in response to the incidence of light. In practice, the P-type impurity has a concentration of $5 \times 10^{15}$ to $5 \times 10^{18}$ atom/cm$^3$ in a region of the I-type layer except those near the P-type layer.

Thus the device of the present invention produces such excellent effects that a high photoelectric conversion efficiency can be achieved and it will not be impaired by the incidence of radiant, neutron or electron rays.

Moreover, according to the manufacturing method, the photoelectric conversion device of such excellent advantages as mentioned above can be fabricated by steps of forming a first electrode on a substrate, forming, on the first electrode, a PIN structure having P-type, I-type and N-type layers laminated in that order or in the reverse order, and forming a second electrode on the PIN structure. In this case, the I-type layer is doped with the alkali metal element impurity. One method therefor is to form the P-type, I-type and N-type layers by means of such various chemical vapor deposition methods (CVD methods) as CVD, photo CVD, plasma CVD and so forth and to use an alkali metal element material gas in the formation of the I-type layer by the CVD method. Another method is to dip the PIN structure into an aqueous solution of the alkali metal element impurity before forming the second electrode. Still another method is to implant ions of the alkali metal element impurity into the PIN structure after forming the PIN structure.

With the first method mentioned above, since the I-type layer can be doped with the alkali metal element impurity at the same time as it is formed, the photoelectric conversion device can be fabricated in a short time and with ease. With the second method, since the I-type layer can be doped with the alkali metal element impurity simply by dipping the PIN structure into an aqueous solution of the alkali metal element impurity after forming the PIN structure, the device can easily be obtained. With the third method, since the impurity concentration in the I-type layer can easily be controlled in the case of ion implantation of the alkali metal element impurity, the device can easily be produced.

Further, according to the manufacturing method of the present invention, the P-type layer is formed of a semiconductor material which is $Si_xC_{1-x}$ (where $0<x<1$, preferably, $x=0.2$ to 0.3), prior to the formation of the I-type layer. With such a method, since the I-type layer is doped with the alkali metal element impurity by the abovesaid dip method or ion implantation method after the formation of the PIN structure and since the alkali metal element has the N-type conductivity, even if the N-type layer is doped with the alkali metal element impurity, it does not matter. Moreover, since the P-type layer has a property of preventing the alkali metal element impurity of the N-type conductivity from entering thereinto, there is no possibility that the P-type impurity concentration in the P-type layer becomes lower than a predetermined value or the P-type layer is made N-type.

Other objects, features and advantages of the present invention will become more fully apparent from the following detailed description taken in conjunction with the accompanying drawings.

DESCRIPTION OF THE PREFERRED EMBODIMENTS

Figure 1:
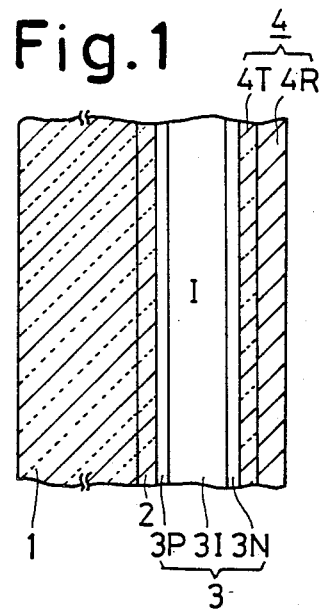
FIG. 1 is a sectional view schematically illustrating a first embodiment of the photoelectric conversion device of the present inventions.

FIG. 1 illustrates a first embodiment of the photoelectric conversion device of the present invention, in which a transparent electrode 2 of a conductive oxide such as tin oxide is deposited, for example, by means of an evaporation method, on a transparent substrate 1 made of a transparent insulating material such as glass.

The transparent electrode 2 has formed thereon a PIN structure 3.

The PIN structure 3 comprises P-type, I-type and N-type non-single-crystal semiconductor layers 3P, 3I and 3N which are laminated in that order, for instance. The P type layer 3P is formed of, for example, $Si_xC_{1-x}$ (where $0<x<1$, preferably $x=0.2 \sim 0.3$) and has a thickness of, for instance, 100 to 200 Å. The I-type 3I is formed of, for instance, silicon and has a thickness of, for example, 0.4 to 1.0 $\mu$m. The N-type layer 3N is formed of, for example, silicon and has a thickness of, for instance, 200 to 500 Å.

When the P-type layer 3P is formed of the abovesaid $Si_xC_{1-x}$, it can be obtained in a reaction chamber by means of such a known CVD method as a low-temperature CVD, photo CVD, plasma CVD or like method, using, for example, silane ($Si_nH_{2n+2}$, where n =1, 2, ...) and dimethyl silane ($H_2Si(CH_3)_2$) as semiconductor material gases and, for instance, diborane ($B_2H_6$) diluted with silane ($SiH_4$) as a P-type impurity material gas.

When the I-type layer 3I is formed of silicon, it can be obtained with the same reaction chamber as that for the P-type layer 3P or with a separate chamber by means of the abovesaid CVD method using the above-mentioned silane ($SiH_{2n+2}$) as a semiconductor material gas and, if necessary, hydrogen as the recombination center neutralizer.

In this case, the I-type layer 3I is formed so that it does not contain the oxygen and/or nitrogen impurity which will impair the mobility of carriers which are created by light irradiation in the I-type layer 3I. To this end, a refined semiconductor material gas obtained by removing water, oxygen, nitrogen, etc. from an original semiconductor material gas is employed as the semiconductor material gas. Prior to the introduction of the semiconductor material gas into the reaction chamber, hydrogen or helium is flowed into the reaction chamber to clean it and a gas supply pipe and gas exhaust means connected thereto, after which the reaction chamber is fully evacuated so that water, oxygen, nitrogen and so forth may not remain therein. Further, when a pump is employed as the gas exhaust means, a turbo molecular pump is used which is free from the fear of introducing into the chamber an oil component which forms a nitrogen component. The reaction chamber and the exhaust means and so on connected thereto are made airtight.

When the N-type layer 3N is formed of silicon, it can be obtained with the same reaction chamber as that for the P-type and/or I-type layer or with separate chamber by means of the above said CVD method using the abovesaid as a semiconductor material gas and, an N-type impurity material gas, phosphine ($PH_3$) diluted with silane ($SiH_4$), for example.

Figure 3:
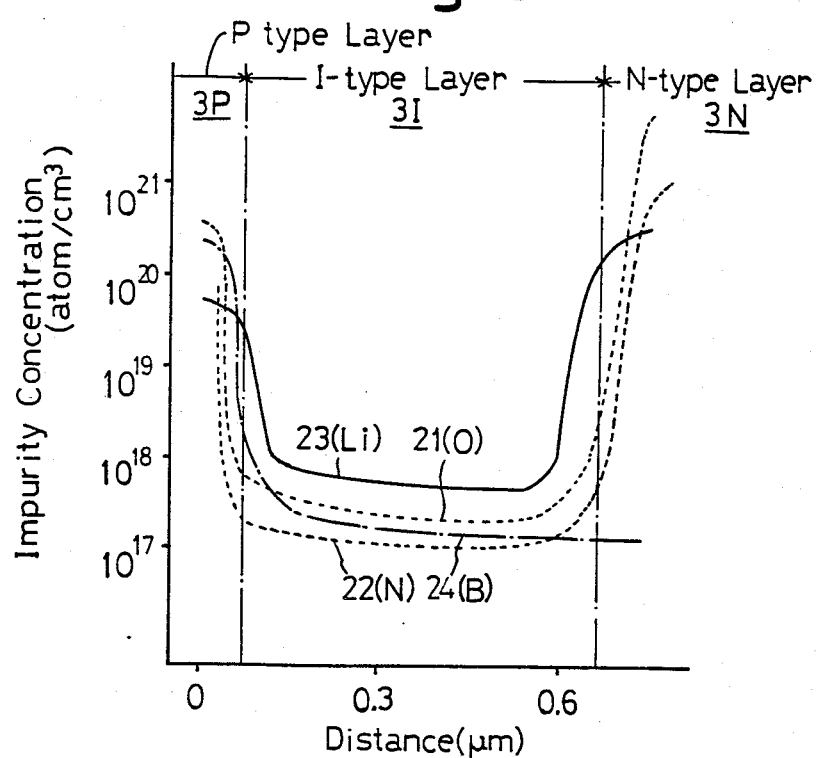
FIG. 3 is a graph showing impurity concentration distributions in the PIN structure, for explaining the first and second embodiments depicted in FIGS. 1 and 2.

The PIN structure 3 thus formed has, in its thickwise direction, such oxygen and nitrogen impurity concentration distributions as indicated by the curves 21 and 22 in FIG. 3. In particular, the I-type layer contains, in its region except those near the P-type and N-type layers, the oxygen and nitrogen impurities in concentrations of as low as $5 \times 10^{18}$ atoms/cm$^3$ or below.

Further, the I-type layer 3I is doped with the alkali metal element impurity in a concentration higher than those of the oxygen and nitrogen impurities contained in the layer. The alkali metal element impurity is lithium (Li), sodium (Na) or potassium (K).

The I-type layer doped with the alkali metal element impurity can be formed by using the alkali metal element material gas in the formation of the I-type layer by the CVD method, as described previously. In this case, when the alkali metal element impurity is lithium (Li), the alkali metal element material gas may be, for example, methyl lithium (CH$_3$Li) gas or ethyl lithium (C$_2$H$_5$Li) gas. When the alkali metal element impurity is sodium (Na), for example, methyl sodium (CH$_3$Na) gas can be used. In the case of potassium (K), for example, methyl potassium (CH$_3$K) gas can be employed.

Moreover, the I-type layer doped with the alkali metal element impurity can be obtained by dipping the PIN structure 3 into an aqueous solution of the alkali metal element impurity after forming the PIN structure 3 in the manner described previously. In this case, as the aqueous solution of the alkali metal element impurity can be used an aqueous solution which contains lithium (Li), sodium (Na) or potassium (K) in a concentration of, for instance, 1 to 10 normal and has a temperature of, for example, 80° C. In the case where the I-type layer doped with the alkali metal element impurity is formed in this way, the surface of the PIN structure 3 is sufficiently rinsed with water and an oxide layer formed on the surface of the PIN structure 3 by virtue of natural oxidation is removed using an aqueous solution of fluoric acid.

Furthermore, the I-type layer doped with the alkali metal element impurity can be obtained by implanting ions of the alkali metal element which is lithium (Li), sodium (Na) or potassium (K) into the I-type layer 3I after forming the PIN structure 3.

By doping the I-type layer with the alkali meal element impurity as described above, the PIN structure 3 has, in its thickwise direction, such an alkali element impurity concentration distribution as indicated by the curve 23. In particular, the I-type layer is doped with the alkali metal element impurity in a concentration higher than that of the oxygen and nitrogen impurities but lower than $2 \times 10^{19}$ atoms/cm$^3$ in the region except those near the P-type and N-type layers.

Besides, the I-type layer is doped with a P-type impurity so as to compensate for the N-type conductivity of the alkali metal element impurity. The P-type impurity is, for example, boron.

The I-type layer can be doped with the P-type impurity using a P-type impurity material gas when it is formed by the aforesaid CVD method. In this case, when the P-type impurity is boron, the P-type impurity material gas is, for instance diborane ($B_2H_6$).

By doping the I-type layer 3I with the P-type impurity as mentioned above, the PIN structure 3 has, in its thickwise direction, such a P-type impurity concentration distribution as indicated by the curve 24 in FIG. 3. In particular, the I-type layer 3I is doped with the P-type impurity to the same extent as the oxygen and nitrogen in the region except those near the P-type layer.

The PIN structure 3 has formed thereon a reflective electrode 4. The reflective electrode 4 comprises a transparent conductive layer 4T of a conductive oxide such as indium oxide and a reflective conductive layer 4R of aluminum which are laminated in that order. The transparent conductive layer 4T and the reflective conductive layer 4R can be deposited by the evaporation technique.

The above is the construction of the first embodiment of the semiconductor photoelectric conversion device of the present invention.

With the device of such a construction as described above, light incident to the transparent substrate 1 passes through it and the transparent electrode 2 and enters into the I-type layer 3I through the thin P-type layer 3P of the PIN structure 3. The light having thus entered into the I-type layer 3I creates therein carriers, i.e. electron-hole pairs. The incident light is mostly absorbed by the I-type layer 3I, but unabsorbed light passes through the N-type layer 3N and enters into the reflective electrode 4, where it is reflected back to the I-type layer 3I through the N-type layer 3N. By the reentered light, carriers are developed in the I-type layer 3I. Of the carriers or electron-holes pairs thus created in the I-type layer 3I, electrons flow through the N-type layer 3N to reach the reflective electrode 4, whereas holes flow through the P-type layer 3P to reach the transparent electrode 2. By the abovesaid mechanism, photo voltaic power is generated across the electrodes 2 and 4. In this case, since the recombination centers in the I-type layer are neutralized by the recombination center neutralizer and since the concentration of oxygen and/or nitrogen contained in the I-type layer, which lowers the carrier mobility, is as low as $5 \times 10^{18}$ atoms/cm$^3$ or below, a high photo voltaic power can be obtained. Accordingly, the above-described embodiment of the present invention achieves a photoelectric conversion efficiency as high as 10.3%/1.05 cm$^2$ under AM-1 (100 mW/cm$^2$) condition radiation.

With the photoelectric conversion device of the above-described embodiment, when it is irradiated by radiant, neutron or electron rays, recombination centers are newly created in the I-type layer 3I. Since the I-type layer 3I is doped with the alkali metal element impurity, however, the alkali metal element impurity combines with the newly generated recombination centers, neutralizing them. On the other hand, the I-type layer 3I is doped with a P-type impurity such as boron so as to compensate for the N-type conductivity of the alkali metal element impurity with which the layer 3I is doped with. Accordingly, even if the photoelectric conversion device is exposed to irradiation by radiant, neutron or electron rays, the abovesaid high conversion efficiency will not greatly be decreased.

Figure 4:
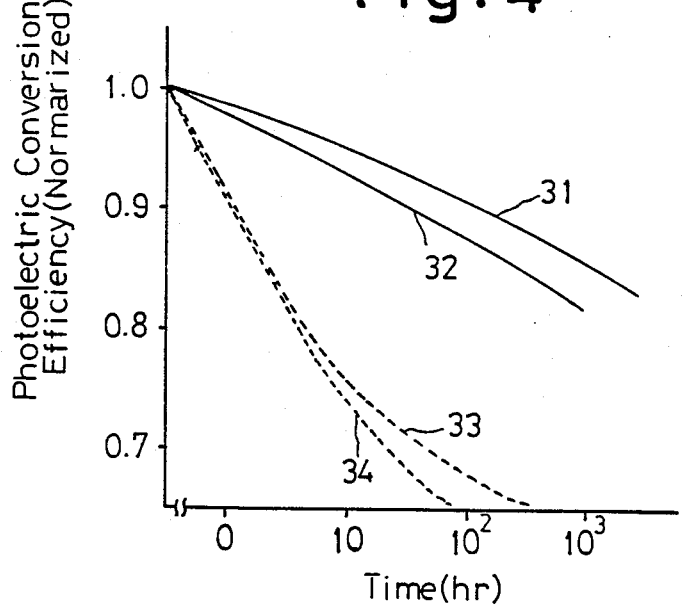
FIG. 4 is a graph showing variations in the photoelectric conversion efficiency of the device with the time of incidence of electron rays to the device, for explaining the first and second embodiments illustrated in FIG. 1 and 2.

The curve 31 in FIG. 4 shows variations in the photoelectric conversion efficiency with the time (in hour) of irradiation by radiant, neutron or electron rays to the photoelectric conversion device of the abovesaid embodiment in the case where the I-type layer 3I is formed of silicon, contains the oxygen and nitrogen impurity in the concentration indicated by the curve 21 in FIG. 3 and doped with lithium (Li) as the alkali metal element impurity in the concentration indicated by the curve 23 in FIG. 3 and boron (B) as the P-type impurity in the concentration indicated by the curve 24 in FIG. 3, the photoelectric conversion efficiency being normalized on the basis of the conversion efficiency being 1 in the case where the device is not irradiated by such rays. The curve 32 in FIG. 4 shows similar variations in the photoelectric conversion efficiency in the case where the I-type layer 3I is formed of silicon, contains the oxygen and nitrogen impurity in the abovesaid concentration and doped with lithium (Li) as the alkali metal element impurity in the abovesaid concentration but is not doped with the P-type impurity. The curve 33 in FIG. 4 shows similar variations in the photoelectric conversion efficiency in the case where the I-type layer 3I is formed of silicon and contains the oxygen and nitrogen impurity in the abovesaid concentration but is not doped with the alkali metal element impurity and the P-type impurity. The curve 34 in FIG. 4 shows similar variations in the photoelectric conversion efficiency in the case where the I-type layer 3I is formed of silicon and contains the alkali metal element impurity in the abovesaid concentration but is not doped with the P-type impurity and contains the oxygen and nitrogen impurity in a concentration of about $2 \times 10^{20}$ atoms/cm$^3$. Comparison of these curves 31 to 34 indicates that according to the embodiments of the present invention, irradiation by radiant, neutron or electron rays will cut down the aforementioned high photoelectric conversion efficiency only very slightly.

Figure 2:
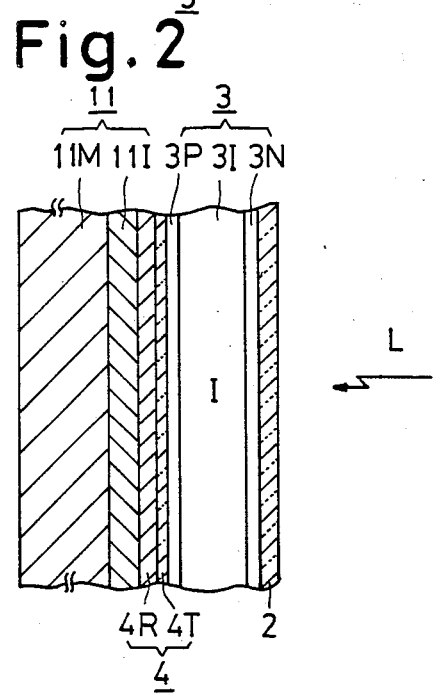
FIG. 2 is a sectional view schematically illustrating a second embodiment of the photoelectric conversion device of the present invention.

FIG. 2 illustrates a second embodiment of the semiconductor photoelectric conversion device of the present invention, in which like parts corresponding to those in FIG. 1 are identified by the same reference numerals and no detailed description will be repeated.

In this embodiment, the same reflective electrode 4, the same PIN structure 3 and the same transparent electrode 2 as those described in connection with FIG. 1 are sequentially laminated in that order on a substrate 11 having structure member 11M as of stainless steel ad an insulating film 11I as of heat resistant resin deposited on substrate member 11M. In this case, the reflective electrode 4 has the construction that the same reflective conductive layer 4R and transparent conductive layer 4I as those described previously with respect to FIG. 1 are laminated in that order on the insulating film 11I. The PIN structure 3 has the construction that the same N-type, I-type and P-type layers 3N, 3I and 3P as those described previously in respect of FIG. 1 are laminated in that order on the reflective electrode 4.

According to such a second embodiment, by light incident to the device on the side of the transparent electrode 2, photo voltaic power can be generated across the transparent electrode 2 and the reflective electrode 4 through the same mechanism as described previously in conjunction with FIG. 1.

In this case, since recombination centers are neutralized by the recombination center neutralizer in the I-type layer 3 and since the layer 3I is doped with alkali metal element impurity and P-type impurity, the same excellent effecteds as those described previously in connection with FIG. 1 can be produced though not described in detail.

It will be apparent that many modifications and variations may be effected without departing from the scope of the novel concepts of the present invention.

What is claimed is:

1. A semiconductor device comprising:
a substrate; and
a non-single-crystalline semiconductor layer formed on said substrate and including an intrinsic region; wherein the intrinsic region of said semiconductor layer is doped with lithium for neutralizing trapping centers generated by incident radiant rays and doped with boron for compensating the conductivity type which is biased by virtue of said doping of lithium and the concentration of lithium in the intrinsic region is below $2 \times 10^{19}$ atom/cm$^3$ and the concentration of the boron is in the range of $5 \times 10^{15}$ to $5 \times 10^{18}$ atom/cm$^3$ to form the intrinsic region.

2. A semiconductor device as in claim 1 including a lower electrode disposed between said semiconductor layer and the substrate and an upper electrode disposed on the semiconductor layer so that the semiconductor device functions as a photoelectric conversion device.

3. A semiconductor device as in claims 1 or 2 where said semiconductor layer includes a PIN junction, an NI junction, or a PI junction.

4. A semiconductor device as in claims 1 or 2 including oxygen and sodium in the intrinsic region where the concentration of the oxygen is below $5 \times 10^{18}$ atom/cm$^3$ and the concentration of the sodium is below $2 \times 10^{19}$ atom/cm$^3$.

5. A semiconductor device to claim 1 wherein the intrinsic region contains an oxygen and/or nitrogen impurity and the concentration of lithium is higher than the concentration of the oxygen and/or nitrogen impurity contained in the intrinsic region of the non-single-crystalline semiconductor layer.

6. A semiconductor device to claim 3 wherein the intrinsic region contains an oxygen and/or nitrogen impurity and the concentration of the oxygen and/or nitrogen impurity in the intrinsic region of the non-single-crystalline semiconductor layer is below $5 \times 10^{18}$ atom/cm$^3$ in a region except those near the P-type or N-type regions.

7. A semiconductor photoelectric conversion device according to claim 3 wherein the P-type semiconductor layer region is formed of $Si_xC_{1-x}$ (where $0 < x < 1$).

* * * * *